United States Patent
Walker et al.

(10) Patent No.: US 8,596,985 B2
(45) Date of Patent: Dec. 3, 2013

(54) METHOD OF PROTECTING A COMPONENT AGAINST HOT CORROSION AND A COMPONENT PROTECTED BY SAID METHOD

(75) Inventors: Paul Mathew Walker, Dunholme (GB); Mick Whitehurst, Heighington (GB)

(73) Assignee: Siemens Aktiengesellschaft, München (DE)

( * ) Notice: Subject to any disclaimer, the term of this patent is extended or adjusted under 35 U.S.C. 154(b) by 675 days.

(21) Appl. No.: 12/227,911

(22) PCT Filed: May 31, 2007

(86) PCT No.: PCT/EP2007/055296
§ 371 (c)(1),
(2), (4) Date: Dec. 2, 2008

(87) PCT Pub. No.: WO2007/147708
PCT Pub. Date: Dec. 27, 2007

(65) Prior Publication Data
US 2009/0185912 A1    Jul. 23, 2009

(30) Foreign Application Priority Data
Jun. 24, 2006 (GB) .................................. 0612576.9

(51) Int. Cl.
*F03D 11/02* (2006.01)
(52) U.S. Cl.
USPC ................... 416/241 R; 416/241 B; 427/256; 427/258
(58) Field of Classification Search
USPC .......... 416/241 R, 241 B; 427/256, 261, 258, 427/260, 265
See application file for complete search history.

(56) References Cited

U.S. PATENT DOCUMENTS

| 3,948,689 | A | | 4/1976 | Baldi |
| 4,606,967 | A | * | 8/1986 | Mosser .......................... 428/220 |
| 6,270,318 | B1 | * | 8/2001 | Shah et al. ................ 416/193 A |
| 6,283,715 | B1 | * | 9/2001 | Nagaraj et al. ............. 416/241 R |
| 6,444,332 | B1 | * | 9/2002 | Bettridge ...................... 428/630 |
| 2005/0084706 | A1 | | 4/2005 | Das et al. |

FOREIGN PATENT DOCUMENTS

| EP | 1 672 174 A1 | 6/2006 |
| GB | 1077735 | 8/1967 |
| GB | 2 356 396 A | 5/2001 |

(Continued)

OTHER PUBLICATIONS

Communication from Gorodissky & Partners, Sep. 1, 2011, pp. 1-2, 1-5, 1-10.

*Primary Examiner* — Fernando L Toledo
*Assistant Examiner* — Robert Bachner

(57) ABSTRACT

A method of protecting a component, in particular a turbine blade, from the effects of hot corrosion includes the steps of applying a chromium diffusion coating to the component and applying a coating of a ceramic material to one or more selected regions of the chromium diffusion coating. The selected regions are regions which, in subsequent use of the component, are subjected to temperatures lower than a predetermined temperature. The ceramic material preferably includes a binder combined with a metal oxide. In a preferred embodiment, a turbine blade is coated over the whole of its internal and external surfaces with the chromium diffusion coating; an aluminum diffusion coating is then applied, through a mask, to the aerofoil surfaces and the internal surfaces of the blade; the mask is removed and the ceramic material is applied as an overlay to the chromium diffusion coating in a region between the platform and the root of the blade.

20 Claims, 1 Drawing Sheet

(56) References Cited

FOREIGN PATENT DOCUMENTS

| | | | |
|---|---|---|---|
| GB | 2 401 117 A | | 11/2004 |
| GB | 2401117 A | * | 11/2004 |
| GB | 2 421 032 A | | 6/2006 |
| RU | 2272089 C1 | | 3/2006 |
| SU | 1696578 A1 | | 12/1991 |

* cited by examiner

U.S. 8,596,985 B2

METHOD OF PROTECTING A COMPONENT AGAINST HOT CORROSION AND A COMPONENT PROTECTED BY SAID METHOD

CROSS REFERENCE TO RELATED APPLICATIONS

This application is the US National Stage of International Application No. PCT/EP2007/055296, filed May 31, 2007 and claims the benefit thereof. The International Application claims the benefits of British application No. 0612576.9 filed Jun. 24, 2006, both of the applications are incorporated by reference herein in their entirety.

FIELD OF INVENTION

The invention relates to a method of protecting a component against hot corrosion, and to such a method in which the component is a rotor blade of a gas turbine engine.

BACKGROUND OF THE INVENTION

So-called Type I and Type II hot corrosion can be controlled by adding chromium to the surface of a component by a process known as chromising. This produces a diffused chromium barrier on the component substrate. U.S. Pat. No. 6,283,715, published on 4 Sep. 2001, describes the use of such a diffused chromium layer on the surface of a turbine blade, and specifically on a part of the blade below the so-called platform and on an aerofoil part above the platform.

While the use of a diffused chromium layer by itself offers good protection against Type II corrosion, protection against the higher-temperature Type I corrosion usually requires the addition of diffused aluminum, which results in a chrome-modified aluminide coating on the substrate surface. Such a constitution is also described in U.S. Pat. No. 6,283,715, the aluminum diffusion layer being applied to the chromium diffusion layer in the aerofoil region above the platform. This patent also describes the application of an overlay layer in the form of a ceramic coating, which serves as a thermal barrier coating to insulate the underlying layers. This overlay is applied to the aerofoil part of the blade only.

U.S. Pat. No. 6,270,318, published on 7 Aug. 2001, describes a turbine blade, in which the area between the platform and the root is coated with a ceramic overlay. U.S. Pat. No. 6,296,447, published on 2 Oct. 2001, discloses a turbine blade having an upper platform surface which is coated with a first layer, which may be a diffusion aluminide layer, followed by a second, ceramic layer. A similar coating arrangement is employed on the pressure side of the aerofoil of the blade in question.

SUMMARY OF INVENTION

In accordance with a first aspect of the present invention there is provided a method of protecting a component against hot corrosion, comprising the steps of:
(1) applying a chromium diffusion coating to the component, and
(2) applying a coating of a ceramic material to one or more selected regions of the chromium diffusion coating, the one or more selected regions being those that, in subsequent use of the component, are subjected to temperatures lower than a first predetermined temperature.

The ceramic material preferably contains one or more metal oxides in a binder material. The metal oxides may be selected from a group consisting of aluminum, titanium and chromium oxide, while the binder material may be a chromate-phosphate material.

The first predetermined temperature may be approximately 800° C.

Step (1) may be such that it produces a chromium coating between 5 and 25 µm thick. It may also produce a chromium diffusion coating containing between 15 and 30 wt % chromium.

Step (1) may comprise applying the chromium diffusion coating to the whole component, and step (2) may comprise the steps of:
(2a) masking out at least the selected regions;
(2b) applying an aluminum diffusion coating to the unmasked regions;
(2c) removing the mask, and
(2d) applying the coating of ceramic material at around room temperature to the one or more selected regions.

The method may further comprise between steps (2b) and (2c) and after step (2d), respectively, the steps of:
(2b') heat-treating the component at a second predetermined temperature, thereby to maintain desired mechanical properties, and
(2d') heat-treating the ceramic coating at a third predetermined temperature.

The second and third predetermined temperatures may lie within the respective ranges 850-1150° C. and 100-600° C.

Step (2b) may be such that it produces a chrome-modified aluminide coating having a beta-phase microstructure of between 15 and 30 wt % aluminum and between 5 and 15 wt % chromium.

The component may have internal surfaces and steps (1) and (2b) may comprise applying, respectively, the chromium diffusion coating and the aluminum diffusion coating to the internal surfaces.

The component may be a turbine blade, in which case the selected regions to which the ceramic is applied may include a region between a platform portion and a root portion of the turbine blade.

Step (2a) may comprise masking out the selected regions and the root portion.

Under a second aspect of the invention a component has a coating to protect against hot corrosion, the coating comprising: a chromium diffusion coating disposed on a surface of the component, and a coating of a ceramic material disposed on one or more selected regions of the chromium diffusion coating, the one or more selected regions being those that, in subsequent use of the component, are subjected to temperatures lower than a predetermined temperature.

The component may be a turbine blade, in which case the ceramic coating may be disposed on a part of the blade between a platform portion and a root portion thereof.

A part of the blade above the platform portion may be provided with an aluminum diffusion coating interdiffused with a chromium diffusion coating.

The turbine blade may comprise an internal passage and the internal passage may be provided with an aluminum diffusion coating interdiffused with a chromium diffusion coating.

The interdiffused aluminum and chromium coatings may have a beta-phase microstructure of between 15 and 30 wt % aluminum and between 5 and 15 wt % chromium.

A root portion of the blade may be provided with a chromium diffusion coating.

The ceramic material preferably contains one or more metal oxides in a binder material. The metal oxides may be selected from a group consisting of aluminum, titanium and chromium oxide, while the binder material may be a chromate-phosphate material.

The chromium diffusion coating may be between 5 and 25 μm thick and may contain between 15 and 30 wt % chromium.

BRIEF DESCRIPTION OF THE DRAWINGS

An embodiment of the invention will now be described, by way of example only, with reference to the attached drawings, of which.

DETAILED DESCRIPTION OF INVENTION

Figure 1:
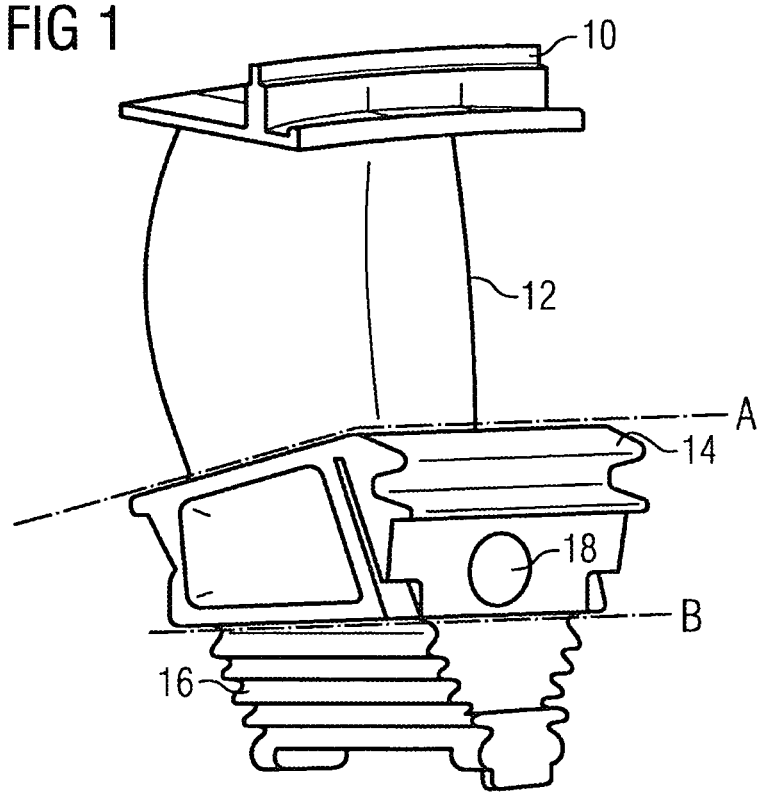
FIG. 1 is a perspective view of a component in accordance with the invention.
Figure 2:
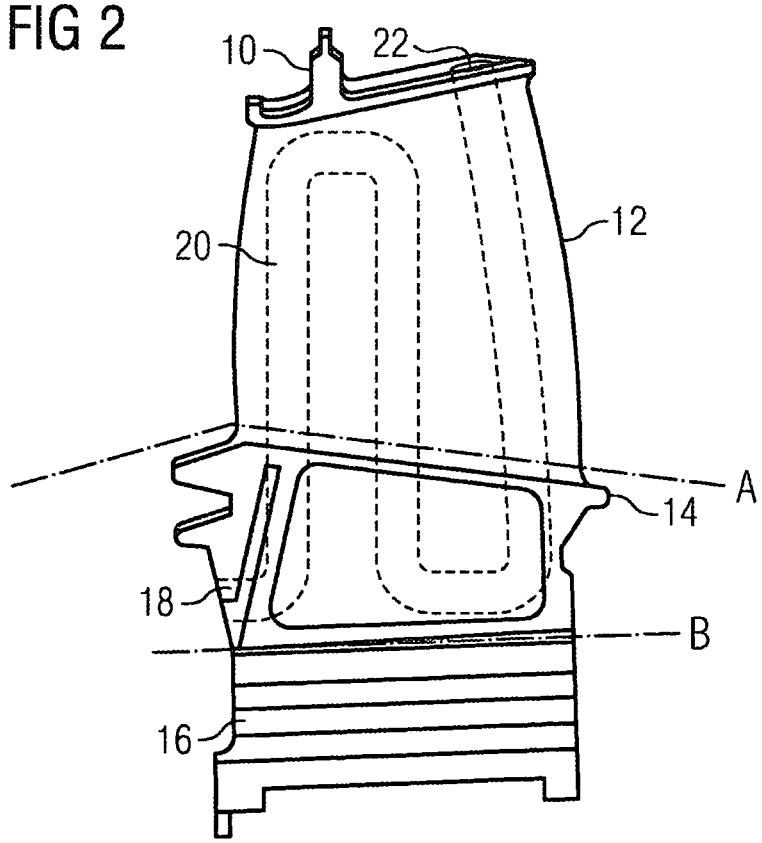
FIG. 2 is a side view of the component illustrated in FIG. 1.

The component shown in FIGS. 1 and 2 is a turbine blade. The blade comprises a shroud portion 10, which lies at the upper end of an aerofoil portion 12. The lower end of the aerofoil portion leads into a platform portion 14, which in turn leads into a root portion 16. The root portion is of the well-known "fir-tree" shape for reliable anchoring in a disc (not shown), which carries a number of such blades side by side around its circumference.

The area between the root 16 and the platform 14 in a typical such blade contains an opening 18, which communicates with one end of an internal passageway 20 (shown in dotted lines). The passageway bends back on itself inside the aerofoil portion 12 and terminates at its other end in an opening 22 at the shroud 10. The passageway has the function of passing cooling fluid into and out of the aerofoil portion.

The blade, in the preferred embodiment shown, is manufactured from a nickel base superalloy using a conventional or directionally solidified (including single-crystal) casting method. Typical alloys which may be employed are MarM247, IN6203, CM186DC LC and CMSX-4.

A preferred method for protecting such a blade from the effects of hot corrosion will now be described.

In a first stage, all the surfaces—both external and internal—are chromised. In this process chromium is diffused into the surface of the component by a suitable means. This may be, for example, by pack cementation, above the pack cementation, or by CVD (Chemical Vapour Deposition). This stage achieves a surface layer, which is rich in chromium. The layer typically contains between 15 and 30 wt % of chromium and is typically between 5 and 25 microns thick.

In a second stage, the blade is masked with a suitable medium so as to prevent an aluminide coating, which is to be applied later, from being deposited onto those surfaces of the blade which are to be coated with a ceramic coating (also described later). Such surfaces will be henceforth referred to as "selected regions". In the preferred embodiment, a selected region is the region between the platform 14 and the root 16. In this case, not only is this selected region masked off, but the root portion 16 is also masked off, even though this will not be provided with a ceramic overlay.

Thirdly, the component is aluminised on its external and internal surfaces. In this process—similar to the chromising stage mentioned earlier—aluminum is diffused into the chromised surface by any suitable means. This may be, for example, by pack cementation, above the pack cementation, or by CVD. This results in a chrome-modified aluminide coating with a beta phase microstructure typically having 15-30 wt % of aluminum and 5-15 wt % of chromium in the coating. Other elements present in the coating will depend on the material making up the component substrate.

In a fourth stage the mask is removed and the component is heat-treated to ensure that the substrate maintains the optimum mechanical properties. Such heat-treatment may involve a temperature within the range 850° C. to 1150° C.

Fifthly, the "selected region" of the component is provided with a ceramic overlay coating at around room temperature. Such a coating can be applied by any of dipping, painting with an applicator (e.g. a brush or swab, etc.) or spraying. A suitable ceramic material is one that contains one or more metallic oxides contained in a suitable binder material. Suitable oxides are aluminum oxide, titanium oxide and chromium oxide. The binder preferably takes the form of a chromate-phosphate type material.

In a final, sixth stage, the ceramic coating is heat-treated or cured at a suitably elevated temperature. This temperature preferably lies within a range of 100-600° C.

An advantage of adding the binder to the oxide material making up the ceramic is that it lends ductility to the coating. This is important in view of the expansion of the blade that takes place when it heats up in service. Without the use of the binder, the coating could easily become brittle and crack, which in turn would allow the blade to be subjected to undesirable environmental stresses.

The binder material mentioned above are found to degrade above a temperature of about 800° C. Consequently, such a ceramic coating is intended for use on those portions of the component (in this case, a turbine blade) which are subjected to temperatures lower than this. While this would normally rule out use on the aerofoil portion of the blade, the ceramic could, under most operating conditions, be applied safely to areas below the platform. Furthermore, while the ceramic could also conceivably be applied to the fir-tree root 16 as well as the region between the platform and the root, in practice it is best to refrain from doing so. This is because the clearance between the root and the corresponding grooves in the disc is in most cases smaller than the thickness of the ceramic coating. Furthermore, the flanks (horizontal contact portions) of the fir-tree root experience high contact pressures during operation, which after a long period of time generates surface cracking in the metal. This would grind a ceramic coating to powder, which in turn would act as a wedge, making it extremely difficult to remove the blade from the disc after service. Hence in the preferred embodiment, the ceramic coating is applied solely to the region between the dotted lines A and B in the drawings.

To summarise the coatings which are present on the blade in its final state, the root portion 16 has a chromium diffusion coating only; the external surfaces of the region between the platform and the root (the region between dotted lines A and B) have a chromium diffusion coating plus a ceramic coating, as described; the external aerofoil surfaces have a chrome-aluminised diffusion coating and the internal surfaces of the blade also have a chrome-aluminised diffusion coating.

Whereas it has been assumed that the region of the blade to be coated with the ceramic layer is the region between the platform and the root, any other region may be similarly coated, provided that it is not subjected to a temperature which is higher than can be tolerated by the binder material in question.

Also, although the invention has been described and illustrated in connection with a turbine blade, it is also applicable to other components which are subject to hot corrosion.

The invention claimed is:

1. A method of protecting a component against hot corrosion, comprising:

applying a chromium diffusion coating to all external surfaces of the component; and applying a masking medium to one or more selected regions of the chromium diffusion coating on the component, the one or more selected regions being those that, in subsequent use of the component, are subjected to temperatures lower than a first predetermined temperature;

applying an aluminum diffusion coating to unmasked regions of the chromium diffusion coating;

removing the masking medium; and applying the coating of ceramic material at around room temperature to only the one or more selected regions.

2. The method as claimed in claim 1, wherein the ceramic material contains one or more metal oxides in a binder material.

3. The method as claimed in claim 2, wherein the metal oxides are selected from a group consisting of aluminum, titanium and chromium oxide.

4. The method as claimed in claim 3, wherein the binder material is a chromate-phosphate material.

5. The method as claimed in claim 4, wherein the first predetermined temperature is approximately 800° C.

6. The method as claimed in claim 5, wherein the application of a chromium diffusion coating to the component produces a chromium coating between 5 and 25 µm thick.

7. The method as claimed in claim 6, wherein the chromium diffusion coating contains between 15 and 30 wt % chromium.

8. The method as claimed in claim 1, further comprising the following steps between the steps of removing the mask and applying the ceramic coating:

heat-treating the component after removing the mask, before applying the ceramic material and at a second predetermined temperature determined to maintain desired mechanical properties, and heat-treating the ceramic coating at a third predetermined temperature.

9. The method as claimed in claim 8, wherein the second and third predetermined temperatures lie within the respective ranges 850-1150° C. and 100-600° C.

10. The method as claimed in claim 9, wherein the applied aluminum diffusion coating produces a chrome-modified aluminide coating having a beta-phase microstructure of between 15 and 30 wt % aluminum and between 5 and 15 wt % chromium.

11. The method as claimed in claim 10, wherein the component has internal surfaces and applying the chromium and aluminum diffusion coatings comprise applying, respectively, the chromium diffusion coating and the aluminum diffusion coating to the internal surfaces.

12. The method as claimed in claim 11, wherein the component is a turbine blade.

13. The method as claimed in claim 12, wherein the selected regions include a region between a platform portion and a root portion of the turbine blade.

14. The method as claimed in claim 13, further comprising masking out the root portion along with the selected regions.

15. A turbine blade having a coating to protect against hot corrosion, comprising:

a chromium diffusion coating arranged on all external surfaces of the turbine blade;

a coating of a ceramic material arranged on one or more selected regions of the chromium diffusion coating operatively subjected to temperatures lower than a predetermined temperature;

wherein the ceramic coating is arranged only on a part of the turbine blade between a platform portion and a root portion thereof; and an external surface of the turbine blade above the platform portion is provided with an aluminum diffusion coating interdiffused with a chromium diffusion coating.

16. The turbine blade as claimed in claim 15, wherein the turbine blade comprises an internal passage and the internal passage is provided with an aluminum diffusion coating interdiffused with a chromium diffusion coating.

17. The turbine blade as claimed in claim 15, wherein the interdiffused aluminum and chromium coatings have a beta-phase microstructure of between 15 and 30 wt % aluminum and between 5 and 15 wt % chromium.

18. A turbine blade for a turbine engine, comprising:

a blade portion on a platform that is connected to a root wherein a region between the platform and root is subjected to temperatures lower than a predetermined temperature during operation of the turbine engine;

a chromium diffusion coating on all external surfaces of the blade portion, platform, root and the region between the platform and the root;

an aluminum diffusion coating on the blade portion and platform only and interdiffused with the chromium diffusion coating thereon;

a coating of ceramic material on the chromium diffusion coating only on the region between the platform and root.

19. The turbine blade of claim 18, wherein the interdiffused aluminum and chromium coatings have a beta-phase microstructure of between 15 and 30 wt % aluminum and between 5 and 15 wt % chromium.

20. The turbine blade of claim 19, wherein the ceramic material contains one or metal oxides and a chromate-phosphate binder material.

* * * * *